United States Patent [19]
Daly et al.

[11] Patent Number: 5,873,751
[45] Date of Patent: Feb. 23, 1999

[54] CIRCUITIZED INSULATOR

[75] Inventors: John J. Daly, Chicago; Mark Sidlow, Glendale Heights, both of Ill.

[73] Assignee: Methode Electronics, Inc., Chicago, Ill.

[21] Appl. No.: 568,741

[22] Filed: Dec. 7, 1995

[51] Int. Cl.$^6$ .................................................. H01R 9/09
[52] U.S. Cl. ........................... 439/620; 439/931; 361/761
[58] Field of Search .......................... 439/55, 76.1, 931, 439/620; 361/765, 761, 764

[56] References Cited

U.S. PATENT DOCUMENTS

| 4,226,491 | 10/1980 | Kazama et al. | 439/76.1 |
|---|---|---|---|
| 4,453,903 | 6/1984 | Pukaite | 425/117 |
| 4,695,106 | 9/1987 | Feldman et al. | 439/83 |
| 4,857,002 | 8/1989 | Jensen et al. | 439/76 |
| 5,046,955 | 9/1991 | Olsson | 439/74 |
| 5,094,623 | 3/1992 | Schart et al. | 439/101 |
| 5,118,362 | 6/1992 | St Angelo et al. | 136/256 |
| 5,170,146 | 12/1992 | Gardner et al. | 338/313 |
| 5,450,288 | 9/1995 | Tanuma et al. | 361/761 |
| 5,554,037 | 9/1996 | Uleski | 439/76.1 |
| 5,580,269 | 12/1996 | Fan | 439/79 |
| 5,599,595 | 2/1997 | McGinley et al. | 428/33 |
| 5,606,198 | 2/1997 | Ono et al. | 361/764 |
| 5,682,296 | 10/1997 | Horejs, Jr. et al. | 361/761 |
| 5,725,819 | 3/1998 | Onishi et al. | 264/161 |

FOREIGN PATENT DOCUMENTS

| 405211379 | 8/1993 | Japan | 361/760 |
|---|---|---|---|

*Primary Examiner*—Neil Abrams
*Assistant Examiner*—Tho Dac Ta
*Attorney, Agent, or Firm*—David L. Newman

[57] ABSTRACT

An electrical connector is provided having a circuitized insulator including a housing having an integrally molded shroud and board having an array of holes molded therein and including conductive traces adhered to the board area in order to connect the holes having electrical contacts mounted therein with components mounted on the board.

17 Claims, 2 Drawing Sheets

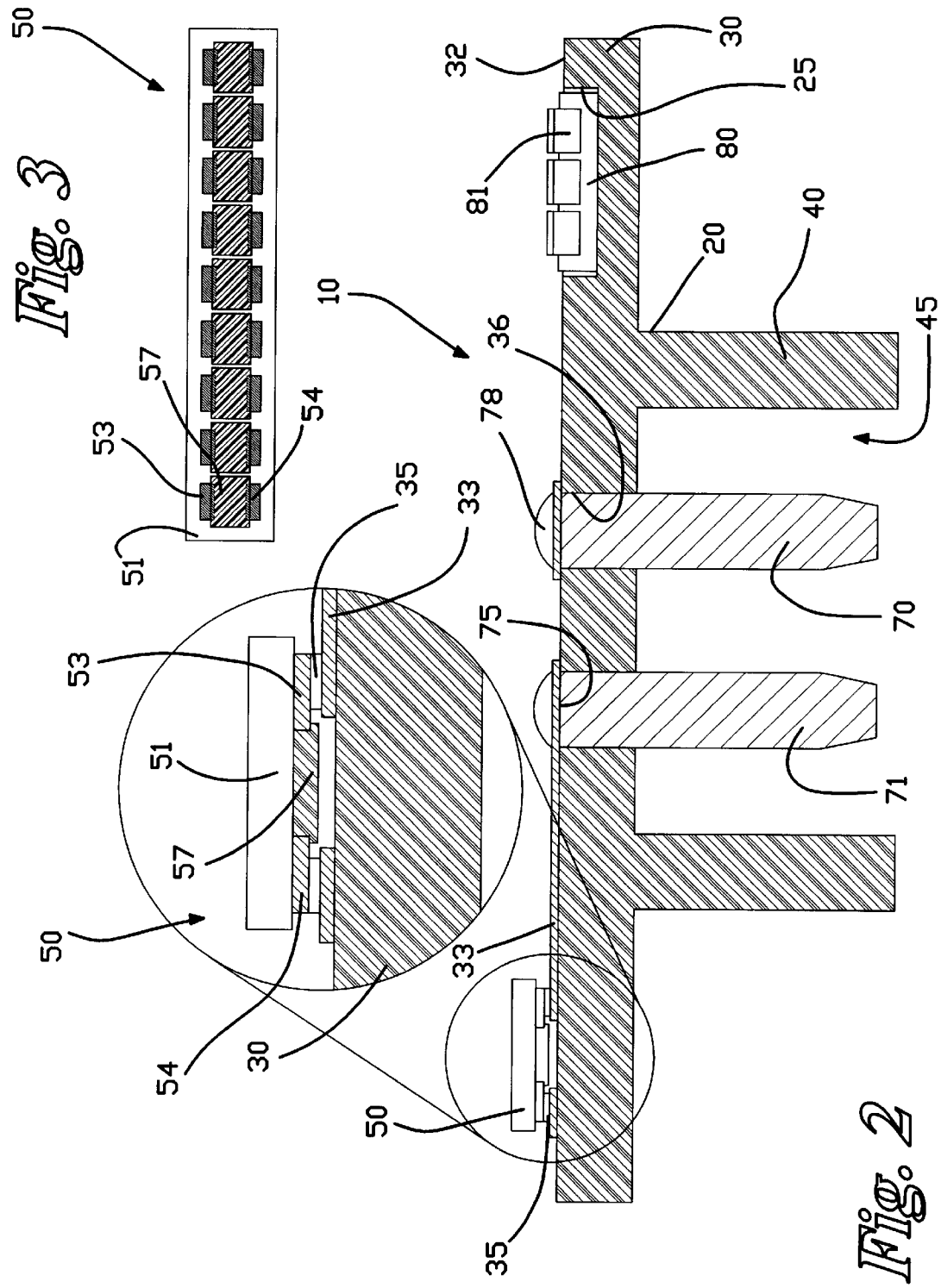

5,873,751

CIRCUITIZED INSULATOR

BACKGROUND OF THE INVENTION

This invention pertains to an electrical connector and, in particular, an electrical connector having a circuitized insulator.

Electrical connectors having contact pins mounted in a printed circuit board are known in the art. For example, U.S. Pat. No. 4,857,002, discloses a circuit board formed of an insulative material having a plurality of holes therethrough, electrically conductive plating extending through the holes and electrical contact members extending through the plated holes. The printed circuit board is mounted in a separate plastic molded housing including a shroud which surrounds the array of contacts protruding from the printed circuit board. As is known in the art, the printed circuit board includes conductive traces which are generally copper tracing which is adhered to the FR4 circuit board via a subtractive process. The printed circuit board is known to have mounted thereto many components including active and passive components such as resistors. The above-mentioned patent discloses the use of thick film polymer resistors adhered directly to the printed circuit board. Such assemblies, as known in the prior art, have disadvantages in that mounting or adhering components to the printed circuit board is a time-consuming and intricate process. In addition, the prior art methods of assembling electrical connectors require multiple parts to act as a substrate for the components and traces and to support the electrical contacts, and a separate substrate to form the housing and shroud of the connector.

It is therefore an object of the present invention to provide an electrical connector which is formed of a minimum of parts in order to provide for a connector which may be quickly and inexpensively manufactured and assembled.

It is another object of the present invention to provide an electrical connector, including a substrate formed of a moldable material which allows for the quick mounting of devices thereon.

It is a further object of the present invention to provide an electrical connector with a circuitized insulator which eliminates the need for a standard FR4 printed circuit board.

It is another object of the present invention to provide a method of forming an electrical connector which provides for the inexpensive and quick assembly of the electrical connector.

SUMMARY OF THE INVENTION

A principal object of this invention is to provide an electrical connector comprising an insulative housing including a board having a plurality of holes therethrough, electrical contacts mounted in the holes, a component mounted to the board and conductive traces adhered to the board connecting at least one of the components to at least one of the holes and a shroud surrounding the contacts, wherein the board and the shroud are integrally molded of a polymer material. The conductive traces may comprise a conductive ink of a composition including a cured polymer matrix and a conductive additive. The component may comprise a ceramic resistor network. The resistor network may include pairs of silver pads connected by a laser trimmed thick-film resistor. The board may include a pocket molded therein having a component mounted in an inverted position within the pocket and having contact tails extend to a top surface of the board to connect to the conductive traces of the board. A cover may be integrally molded with the insulative housing. The electrical contacts may be male contacts extending in a common direction within the shroud in order to form a male connector plug. The electrical contacts may be female contacts extending in a common direction within the shroud in order to form a female connector receptacle. The electrical contacts may be mounted within the insulator via a friction-fit within the holes. The electrical contacts may be mounted to the insulative housing by adherence of a conductive trace at a head portion of the electrical contact and a top surface of the board. The electrical contacts may be secured to the insulative housing by adherence of solder paste to a head portion of the electrical contact at a top surface of the board.

An electrical connector is provided comprising a shroud and a board having a leadless surface mount resistor network component mounted thereto, wherein the resistor network component includes a ceramic substrate having pairs of silver pads adhered thereto and laser trimmed thick-film resistors adhered between the silver pads. The shroud and the board may be integrally molded of a polymer material. The board may include a plurality of holes therethrough and electrical contacts mounted in the holes. The board may include components mounted thereto and conductive traces adhered to the board connecting at least one of the components to at least one of the holes.

A method of forming an electrical connector is provided including the steps of molding an insulator having a shroud, a board and a plurality of holes therethrough, mounting electrical contacts within the holes, adhering conductive traces to the board and the electrical contacts, applying solder to specified areas of the board, placing components in predetermined positions on the board and reflowing the solder in order to connect the components to the board. The method may include the steps of curing the conductive traces prior to applying solder to the board. The method may include adhering solder paste on top of the conductive traces which are adhered on top of a head of the electrical contact mounted within the hole. The method may include mounting of the component to the board via surface mounting in an inverted orientation. The method may include a resistor network formed by adhering silver traces to a ceramic substrate and adhering thick-film resistive ink between the pairs of silver pads and trimming the resistors to a predetermined resistivity, wherein the resistor network is then mounted to the board of the electrical connector.

These and other features of the invention are set forth below in the following detailed description of the presently preferred embodiments.

BRIEF DESCRIPTION OF THE DRAWINGS

FIG. 2 is a side elevation cut-away view of FIG. 1 taken at line 2—2, having an enlarged view of the resistor network mounted to the electrical connector; and FIG. 3 is a bottom view of the resistor network of the present invention.

DETAILED DESCRIPTION OF THE PRESENTLY PREFERRED EMBODIMENTS

Figure 1:
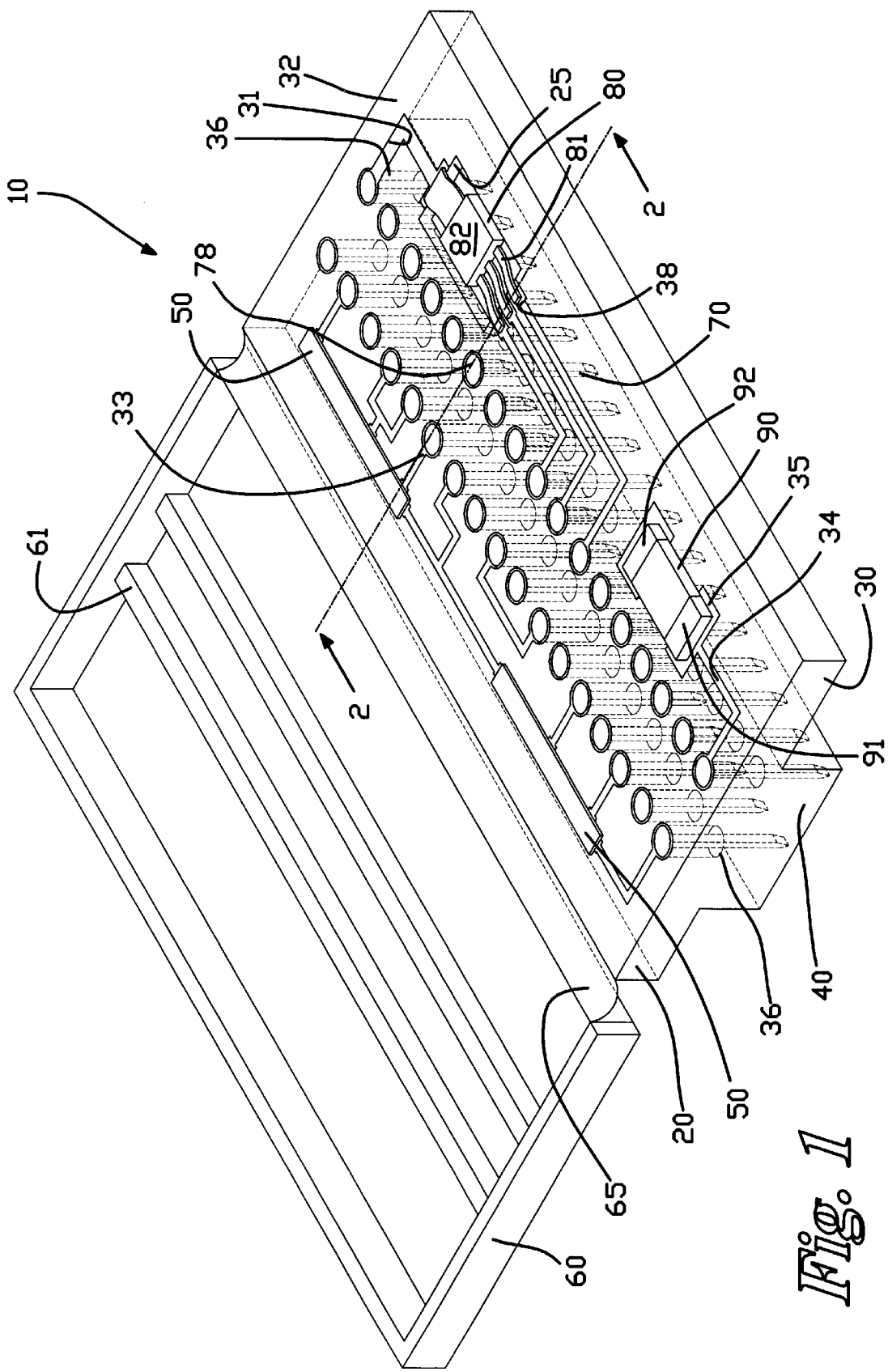
FIG. 1 is a perspective view of the electrical connector of the present invention.

The present invention is best understood by reference to FIGS. 1–3 which disclose the presently preferred embodiment of the invention. Turning to FIG. 1, an electrical connector 10 includes an insulator or insulative housing 20 and a cover 60. The insulative housing 20 includes a molded circuit board (MCB) or board 30 and a shroud 40. In a preferred embodiment, the MCB 30 and shroud 40 are integrally molded in a one-shot process from a polymer material such as a liquid crystal polymer (Vectra 140). However, any moldable material which provides for a flame-resistant insulator and has properties providing for high rigidity, in order to withstand multiple insertions of other connectors mated to the electrical connector 10, and also able to withstand elevated temperatures as high as 200° C. while exhibiting dimensional stability may be used to form the insulator 20. The MCB 30 includes an upper surface 32 which has adhered thereto conductive traces 33. The conductive traces 33 in a preferred embodiment are formed of conductive ink including a cured polymer matrix and a conductive additive, such as ORMET™ 1200 (Toranaga Industries) adhered to the substrate via any method such as screen printing, brush, roller, spraying, dipping, masking, vacuum plating, vacuum deposition or any combination thereof. The method of applying the conductive ink is disclosed in U.S. Pat. No. 5,599,595, which is incorporated herein by reference.

The MCB 30 also includes a plurality of holes 36 which provide a passageway from the top surface 32 of the MCB 30 to the bottom surface 31 of the MCB 30 surrounded by the shroud 40. The holes 36 are molded simultaneously with the molding of the insulator 20. In a preferred embodiment, an array of holes are oriented in pairs. Mounted within the holes are contact pins 70. In a preferred embodiment, the pins 70 are metallic contacts, stamped of beryllium copper. However, any contact may be used having a metallic surface. In an alternate embodiment, the contact 70 may also be integrally molded with the insulator 20 and coated with a conductive coating and include conductive vias at the top surface 32 to provide for a means of carrying electrical signals to the contact 70. It may be understood from the present invention, that there may be any number and orientation of the holes 36 and contacts 70 mounted therein, as the insulator 20 is moldable and any shape may easily be attained. It is also understood that the MCB 30 may also be molded of any shape in order to hold the desired amount of active and passive devices and electrical contacts and also in order to fit with a matable connector or within a specifically shaped area of a device receiving the electrical connector 10, such as within a computer housing.

The conductive traces 33 carry signals from the contacts 70 to active or passive devices mounted on the MCB 30. For example, a resistor network 50, voltage regulator 80 or capacitor 90 may be mounted to the MCB 30. Conductive traces run from the output areas of the devices to specified contacts. Any common means of mounting a device to the MCB 30 may be employed, such as wire bonding, through-hole mounting or surface mounting. For example, surface mount component 90, such as a capacitor, includes metallized ends 91, 92. Conductive trace 34 is formed including a surface mount solder pad 35. As the solder pads 35 may be screen printed, they are easily shaped in any manner and the formation of solder pad 35 can be accomplished merely by forming its negative image in a screen from which the solder is squeegeed through, over the conductive trace 33. The surface mount component 90 may be mounted using standard pick-and-place machinery. The other components to be discussed below, will be mounted simultaneously with the surface mount component 90. The entire electrical connector 10 will then be exposed to high temperatures in order reflow the solder pad 35, in order to form a conductive path between the surface mount component 90 and the conductive trace 34. In a preferred embodiment, the electrical connector 10 is placed in a vapor phase oven in order to reflow the solder pad 35.

An alternate method of mounting components may be understood by explanation of component 80. In a preferred embodiment, component 80 may be a SOT-223 voltage regulator. The component 80 is mounted in an inverted orientation in order to reduce the vertical height or Z-axis of the mounted component on the board area 30. A recess 25 is molded in the MCB 30 having a depth equal to the height of the component 80. The component includes solder tails 81 which include a distal end which is parallel to the top surface 32 of the MCB 30 and an opposite portion which attaches to the component 80 and is bent at an angle generally towards what is normally considered the bottom 82 of the component 80. In the preferred orientation shown in FIG. 1, the component 80 is inverted so that the bottom 82 faces upward. The contact tails 81 generally are mounted to a solder pad 38 so that the bottom 82 of the component 80 is flush with the top surface 32 of the MCB 30. In such an orientation, the component 80 will not take up valuable vertical area above the MCB 30. The contact tails 81 are oriented on solder pads 38 and adhered thereto as discussed above. In an alternate embodiment, the component 80 may be side-mounted which reduces the amount of real estate that the component needs on the MCB 30 in circumstances where the Z-axis dimension or height is not critical. Such side or edge mounting of the component may allow for the components to be placed on ten thousandths centers, as compared to fifty thousandths centers of current surface mounted components. During usage of the electrical connector 10, the component 80 may contract or expand and the recess 25 should be molded of a dimension to compensate for the shrinkage characteristics of the component 80. In an alternate embodiment, the solder pad 38 may also be depressed below the top surface 32 of the MCB 30 by forming a miniature pocket to receive the contact tail 81, in situations where a zero height is necessary. In another alternate embodiment, the contact tail 81 may be gold-plated and gold may be adhered at the pad 38 in order to provide increased conductivity. In another alternate embodiment, the component 80 may be a Cermet board having components attached thereto in order to place multiple components with a single pick-and-place process. The mounting of component 50 will be discussed below.

After mounting of the components and reflowing of the solder pads and curing, assembly of the electrical connector 10 may be completed by securing cover 60. In a preferred embodiment, the cover 60 is integrally molded with the insulator 20 including a living hinge 65. FIG. 1 shows the cover in its open position. The cover 60 is shaped so that it encloses the entire top surface 32 of the MCB 30 and encloses the components 80, 90 and 50 therein. A tab or locking mechanism may be molded with the cover 60 and/or the MCB 30 in order to lock the cover in its closed position. In a preferred embodiment, the cover 60 may be unlatched from the MCB 30 so that it may be reopened in order to inspect the electrical connector 10 at a later time or to add components thereto. In an alternate embodiment where the cover need not be reopened, it may be permanently adhered to the MCB 30 via a chemical bonding procedure or by sonic welding. The cover 60 includes ribs 61 which protrude within the cover and provide for a strain relief for the contact pins 70. Upon mating of the electrical connector 10, the pins may have an axial force applied to them in the upward direction. The ribs 60 abut the top of the contact pin 70 and provides for strain relief from axial pressure placed on the contact pin 70. In accordance with the above description, it may understood that a new and approved electrical connector including sophisticated electronics having a multitude of orientations and being assembled and manufactured quickly and inexpensively is provided. The electrical connector 10 may be a smart connector or in a preferred embodiment provides a pluggable terminator for terminating a computer bus according to the small computer system interface standard ANSI X3T9.2/82-2. However, the novel features of the present invention provide an electrical connector which may be used in other environments as well.

Turning to FIG. 2, a side elevation cut-away view of FIG. 1 taken at line 2—2 is shown. For clarity sake, the cover has been excluded from this view and only the MCB 30 and shroud 40 of the insulative housing 20 of the electrical connector 10 is shown. It can be seen that the MCB 30 and the shroud 40 are integrally molded of one piece to form the insulative housing 20. Contact pins 70, 71 are mounted within holes 36 of the MCB 30 and protrude within the cavity 45 formed by the shroud 40. The contact pins 70, 71 are male contact pins. However, any standard contact having a standard contact shape may be mounted within the electrical connector 10. For example, female contacts having a U-shaped portion within the cavity 45 for receiving male contacts may be provided. In a further alternate embodiment, the contact pins 70, 71 may be feed-through contacts wherein the contact lower portion is housed within cavity 45, as shown, and the contact may also have an upper body portion protruding above the top surface 32 of the MCB 30. In another alternate embodiment, the contacts may also have insulation displacement connection (IDC) tails. A preferred method of mounting the contacts 70, 71 will be described below; however, any standard means of mounting contacts may be employed with the electrical connector 10.

The present invention may be best understood by a description of a preferred method of manufacturing the electrical connector 10. The insulator 20 is molded having a predetermined shape defining the MCB 30 and shroud 40 and simultaneously molding the array of holes 36 within the MCB 30. The holes 36 in a preferred embodiment are molded having a cylindrical shape. However, in an alternate embodiment, the holes 36 may also be any shape such as a rectangular, in order to correspond to the shape of the head of the electrical contact to be received therein. The hole 36 is precision molded in order to provide a friction fit with the contact pins 70, 71 to be received therein. Also, simultaneously molded with the insulator 20 is recess 25. The contacts 70, 71 are then mounted within the holes 36 of the insulator 20. Conductive traces 33 are then adhered to the board area 30 using a process as described above. The conductive traces 33 are adhered onto the head 75 of the electrical contact 71 in order to electrically connect the contacts 70, 71 through the traces 33 to the component mounting areas. In the preferred embodiment, it is not necessary to coat the interior of the holes 36 with a conductive coating, or "plate" the holes. The contacts 70, 71 are sufficiently electrically connected to the conductive traces 33 by having the conductive trace 33 adhered to the head 75 of the contacts 70, 71. However, an alternate embodiment may include holes 36 being coated with conductive composition. The electrical connector 10 having the conductive traces 33 adhered thereto is then exposed to elevated temperatures in order to cure the conductive traces 33. As described above, solder is then adhered on top of the conductive traces 33 in predetermined areas. For example, solder pads 51 are adhered to the conductive traces 33 where components are to be mounted. Also, solder paste 78 is adhered on top of the conductive trace 33 above the head 75 of the electrical contacts 70, 71. The solder paste 78 ensures electrical continuity between the electrical contacts 70, 71 and the conductive trace 33 and also provides for mechanical integrity in securing the electrical contacts 70, 71 to the MCB 30. The components 50, 80, 90 are then placed on the MCB 30 and the electrical connector 10 is exposed to elevated temperatures according to the method as described above in order to reflow the solder pads 51 and solder paste 78. Finally, the cover 60 is secured over the MCB 30.

The component 80 is shown mounted in recess 25 and includes contact tails 81 which protrude from the component and provide for mounting of the tails to the conductive trace 38 on the top surface 32 of the MCB 30. An alternate embodiment of a component package is shown as component 50 having an enlarged view. The component 50 in a preferred embodiment is a leadless ceramic thick-film resistor network (Methode Development Co., Chicago, Ill.). The discrete resistor network 50 is formed of a ceramic substrate 51 which has pairs of silver pads 53, 54 which adhere to the ceramic substrate 51 along the length of the component 50. In a preferred embodiment, the silver pads 53, 54 are adhered using a screen printing process, however, any method such as vacuum deposition or a pad printing process, screen printing, brush, roller, spraying, dipping, masking, vacuum plating, vacuum deposition or any combination thereof may be used. Thick-film resistors 57 are adhered to the substrate 51 between the pairs of silver pads 53, 54 via a screen printing process. The thick-film resistors are trimmed using a laser trimming operation in order to attain the desired resistance level of each individual resistor pad 57. The resistor network component 50 is then inverted so that the substrate side 51 is facing up. The resistor network component 50 is then ready for placement onto the MCB 30. In an alternate embodiment, in circumstances where the resistor network 50 will not be used immediately, the silver pads 53, 54 may be covered with a solder pad in order to limit tarnishing or degradation of the silver pad 53, 54 and to provide for a long shelf life for the resistor component 50.

The enlarged view in FIG. 2 shows the resistor network component 50 mounted to the MCB 30. The MCB 30 includes conductive trace 33 adhered thereto and solder pad 35 adhered to the trace 33. The solder pads 35 and traces 33 are oriented in a predetermined position and spacing according to the spacing of the silver pads 53, 54 of the resistor network component 50. The resistor network component 50 is placed onto the MCB 30 in a preferred embodiment using pick-and-place machinery. The pick-and-place machinery is programmed so that proper location of the component 50 is keyed to the perimeter shape of the substrate 51 being located at a precise position on the MCB 30 so that the silver pads 53, 54 of the component 50 will align with the solder pads 35 of the MCB 30. In addition, during reflow of the solder pads 35, the repositioning of the silver pads 53, 54 will occur due to the changing surface tension between the silver pads 53, 54 and solder pads 35. Turning to FIG. 3, a bottom view of the resistor network component 50 is shown having the ceramic substrate 51 having pairs of silver pads 53, 54 electrically connected by the thick-film resistor 57 along the length of the substrate 51. The silver pads 53, 54 are only adhered to a first side of the substrate 51. Because the component 50 is to be mounted in an inverted position, with the resistors 57 facing the MCB 30, the silver pads 53, 54 which electrically connect the component 50 to the MCB 30 need only be located at the same side of the component where the resistors 57 are adhered, and the silver pads need not continue around the substrate 51 onto the edge or back (second) side of the substrate. The "flip chip" design of the present invention allows for the use of a minimal amount of silver in that a silver pad 53, 54 is adhered in a single plane and has a minimal surface area only large enough for the adherence of the thick-film resistor 57 thereon and a separate adjacent area for electrically connecting the silver pad 53, 54 to a conductive trace 33 of the MCB 30 via a solder pad 35. Therefore, according to the above-described invention, it may be understood that a resistor network component 50 may be quickly and easily placed on the electrical connector 10 and connected thereto. The use of the leadless ceramic thick-film resistor network component 50 allows for the setting of the resistivity of the component separately and independent from the electrical connector. The use of such an independent resistor network component 50 also allows it to be stored for later use and placed on the electrical connector at the desired time in order to allow for a more flexible manufacturing process. In addition, it may be understood that such a resistor network component 50 may be mounted and adhered simultaneously with other surface-mount components 80, 90. However, the present invention may also include the adherence of a resistor network directly to the MCB 30.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

What is claimed is:

1. An electrical connector comprising:
   an insulative housing including;
   a board having a plurality of holes therethrough, electrical contacts mounted in the holes, a component mounted to the board and conductive traces adhered to the board connecting the component to at least one of the holes; and
   a shroud surrounding the contacts, wherein the board and the shroud are integrally molded.

2. The electrical connector of claim 1 wherein the conductive traces comprise a conductive ink of a composition including a cured polymer matrix and a conductive additive.

3. The electrical connector of claim 1 wherein the board includes a recess molded therein having a component mounted in an inverted position within the recess and the component having contact tails extend to a top surface of the board to connect to the conductive traces of the board.

4. The electrical connector of claim 1 wherein a cover is integrally molded with the insulative housing.

5. The electrical connector of claim 1 wherein the electrical contacts are male contacts extending in a common direction within the shroud in order to form a male connector plug.

6. The electrical connector of claim 1 wherein the electrical contacts are mounted within the insulator via a friction fit within the holes.

7. The electrical connector of claim 1 wherein the electrical contacts are mounted to the insulative housing by adherence of a conductive trace at a head portion of the electrical contact and a top surface of the board.

8. The electrical connector of claim 1 wherein the electrical contacts are secured to the insulative housing by adherence of solder paste to a head portion of the electrical contact and a top surface of the board.

9. The electrical connector of claim 1 wherein the board and the shroud are molded of a liquid crystal polymer material.

10. The electrical connector of claim 1 wherein the component comprises a ceramic resistor network.

11. The electrical connector of claim 3 wherein the resistor network includes pairs of silver pads connected by a laser trimmed thick-film resistor.

12. An electrical connector comprising:
    a shroud; and
    a board having a leadless surface mount resistor network component mounted thereto, wherein the resistor network component includes a ceramic substrate having a first side having pairs of silver pads adhered only to the first side and laser-trimmed thick-film resistors adhered between the pairs of silver pads and the pairs of silver pads mounted to the board, wherein the shroud and the board are integrally molded.

13. The electrical connector of claim 12 wherein the board includes a plurality of holes therethrough and electrical contacts mounted in the holes.

14. The electrical connector of claim 12 wherein the board includes components mounted thereto and conductive traces adhered to the board connecting the component to at least one of the holes.

15. An electrical connector comprising:
    a molded polymer board including a recess molded in a top surface of the board having a component mounted in an inverted orientation within the recess, the component having contact tails extend from the component to the top surface to connect the component to conductive traces of the board, wherein the conductive traces comprise a conductive ink of a composition including a cured polymer matrix and a conductive additive screen printed on the board.

16. The electrical connector of claim 15 wherein the board includes a plurality of holes, electrical contacts mounted in the holes and the conductive traces connecting the component to at least one of the holes.

17. The electrical connector of claim 15 including a shroud surrounding contacts protruding from the board wherein the shroud and the board are integrally molded.

* * * * *